United States Patent
Iwashita et al.

(10) Patent No.: US 8,030,878 B2
(45) Date of Patent: Oct. 4, 2011

(54) MOTOR DRIVING DEVICE HAVING POWER FAILURE DETECTION FUNCTION

(75) Inventors: Yasusuke Iwashita, Minamitsuru-gun (JP); Tadashi Okita, Minamitsuru-gun (JP); Masakazu Niwa, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 0 days.

(21) Appl. No.: 12/958,690

(22) Filed: Dec. 2, 2010

(65) Prior Publication Data

US 2011/0182398 A1   Jul. 28, 2011

(30) Foreign Application Priority Data

Jan. 28, 2010   (JP) .................................. 2010-016967

(51) Int. Cl.
    *H02P 27/04*   (2006.01)
(52) U.S. Cl. .................. 318/802; 318/801; 318/779
(58) Field of Classification Search .................. 318/802, 318/801, 800, 34, 365, 364, 779, 727, 400.3
    See application file for complete search history.

(56) References Cited

U.S. PATENT DOCUMENTS

| 5,777,450 A | 7/1998 | Kono et al. |
| 6,133,651 A | 10/2000 | Kono et al. |
| 2004/0201226 A1* | 10/2004 | Spurr .......................... 292/201 |

FOREIGN PATENT DOCUMENTS

| JP | 8-227307 | 9/1996 |
| JP | 10-263973 | 10/1998 |
| JP | 11-178245 | 7/1999 |
| JP | 2005-192353 | 7/2005 |
| JP | 2006-14546 | 1/2006 |

* cited by examiner

*Primary Examiner* — Karen Masih
(74) *Attorney, Agent, or Firm* — Drinker Biddle & Reath LLP

(57) ABSTRACT

A motor driving device that accurately achieves power failure detection according to a power failure tolerance with a relatively simple configuration. A counter input computing unit determines, as a counter input value, a value that is inversely proportional to the power failure tolerance determined from a voltage amplitude value and supplies the counter input value to a counter. The counter accumulates the input value at predetermined intervals and outputs an output value. A comparator determines that power failure occurs if the output of the counter 42 exceeds a threshold value.

2 Claims, 4 Drawing Sheets

MOTOR DRIVING DEVICE HAVING POWER FAILURE DETECTION FUNCTION

RELATED APPLICATION DATA

This application claims priority under 35 U.S.C. §119 and/or §365 to Japanese Application No. 2010-016967, filed Jan. 28, 2010, the entire contents of which are incorporated herein by reference.

BACKGROUND OF THE INVENTION

1. Field of the Invention

The present invention relates to a motor driving device that is provided with a power failure detection function for detecting power failure or voltage sag of a power source.

2. Description of the Related Art

In a motor driving device for driving a machine tool, an industrial machine, a robot and the like, when power failure or voltage sag (hereinafter, the power failure and the voltage sag are collectively referred to as the "power failure") occurs in a commercial input power source and the input power voltage decreases, normal operation cannot continue. For this reason, it is necessary to detect a power failure and switch operation of the driving device to protect the motor driving device, workpieces, or tools used in processing and the like. (See JP8-227307A, JP10-263973A and JP11-178245A.)

As a technique for detecting the power failure, for example, JP2006-14546A describes a technique in which a three-phase AC input voltage is converted into an equivalent voltage vector on two-phase coordinates and an amplitude of the vector is calculated to obtain an amplitude of the input voltage. In this technique, if the value of the input voltage amplitude is continuously less than a predetermined reference voltage value for a predetermined reference time period, it is determined that a power failure has occurred.

However, the time during which the motor driving device can continue normal operation, or power failure tolerance, varies depending on the applied power source voltage amplitude. Consequently, in the technique in which the voltage amplitude is compared with the single reference value to detect the power failure as described in JP2006-14546A, the motor driving device may not be able to be protected or, conversely, the protection may be excessive.

In order to address the above problem, JP2005-192353A proposes a technique in which a plurality of voltage drop detection sections having different reference voltage and reference time values are provided and the power failure is detected based on logical OR operation of outputs from these detection sections.

If an increased number of the voltage drop detection sections are provided according to this proposed technique, the power failure can be detected according to the power failure tolerance of motor driving device. However, a computational load on a computing section of the driving device is unpreferably increased.

SUMMARY OF THE INVENTION

Accordingly, it is an object of the present invention to provide a motor driving device that is provided with a power failure detection function that can accurately achieve power failure detection according to a power failure tolerance with a relatively simple configuration.

According to the present invention, there is provided a motor driving device having a rectifier for converting three-phase AC input power source into DC power, and at least one inverter for converting the DC power into AC power of a desired frequency, comprising: a voltage amplitude detection section for detecting a voltage amplitude value of the three-phase AC input power source; a counter input determination section for determining, as a counter input value, a value that is inversely proportional to a power failure tolerance determined according to the voltage amplitude value detected by the voltage amplitude detection section; a counter for accumulating the counter input value determined by the counter input determination section at predetermined intervals; and a power failure detection section for detecting said power failure or voltage sag by comparing an output of the counter with a predetermined threshold value.

When the counter input value is zero, the output of said counter is reset to its initial value.

DESCRIPTION OF THE PREFERRED EMBODIMENTS

Figure 1:
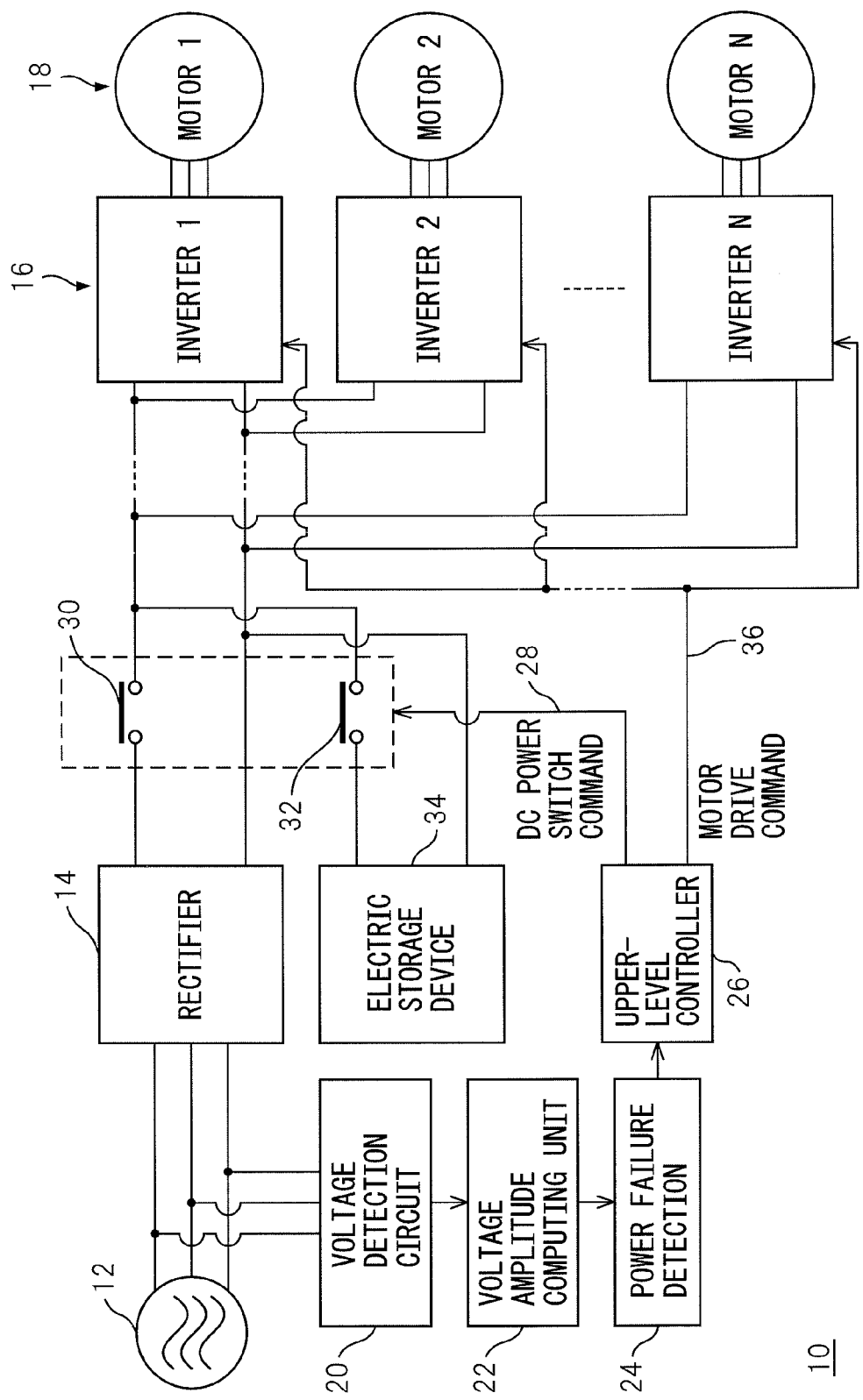
FIG. 1 is a block diagram illustrating a configuration of a motor driving device that is provided with a power failure detection function according to an embodiment of the present invention.

FIG. 1 is a block diagram illustrating a configuration of a motor driving device that is provided with a power failure detection function according to an embodiment of the present invention.

In FIG. 1, this motor driving device 10 includes: a rectifier 14 that converts commercial three-phase AC input power source 12 into DC power; a plurality of inverters 16 whose inputs are connected in parallel to the output of rectifier 14 via a switch 30 so that the DC output from rectifier 14 is converted into variable-frequency three-phase AC power; and a plurality of motors 18 that are connected to the respective outputs of the plurality of inverters 16. A voltage detection circuit 20 detects instantaneous voltage of three-phase AC input power source 12. A voltage amplitude computing unit 22 calculates a voltage amplitude by calculating an equivalent voltage vector on two-phase coordinates from the instantaneous voltage detected by the voltage detection circuit, as set forth in JP2006-14546A described above. Alternatively, voltage detection circuit 20 and voltage amplitude computing unit 22 may be omitted and, in this case, the three-phase AC input power source may be rectified and the voltage amplitude may be calculated from the peak value of the rectified voltage. When a power failure detection section 24 detects power failure of commercial three-phase AC input power source 12 (the function of power failure detection section 24 will be described below), an upper-level controller 26 issues a DC power switch command 28 to open a switch 30 between rectifier 14 and inverters 16 and close a switch 32 so that the DC power source to inverters 16 is changed from rectifier 14 to a electric storage device 34. At the same time, a motor drive command 36 is issued to change an operational mode of inverters 16 to protect the driving device, workpieces, tools and the like.

Figure 2:
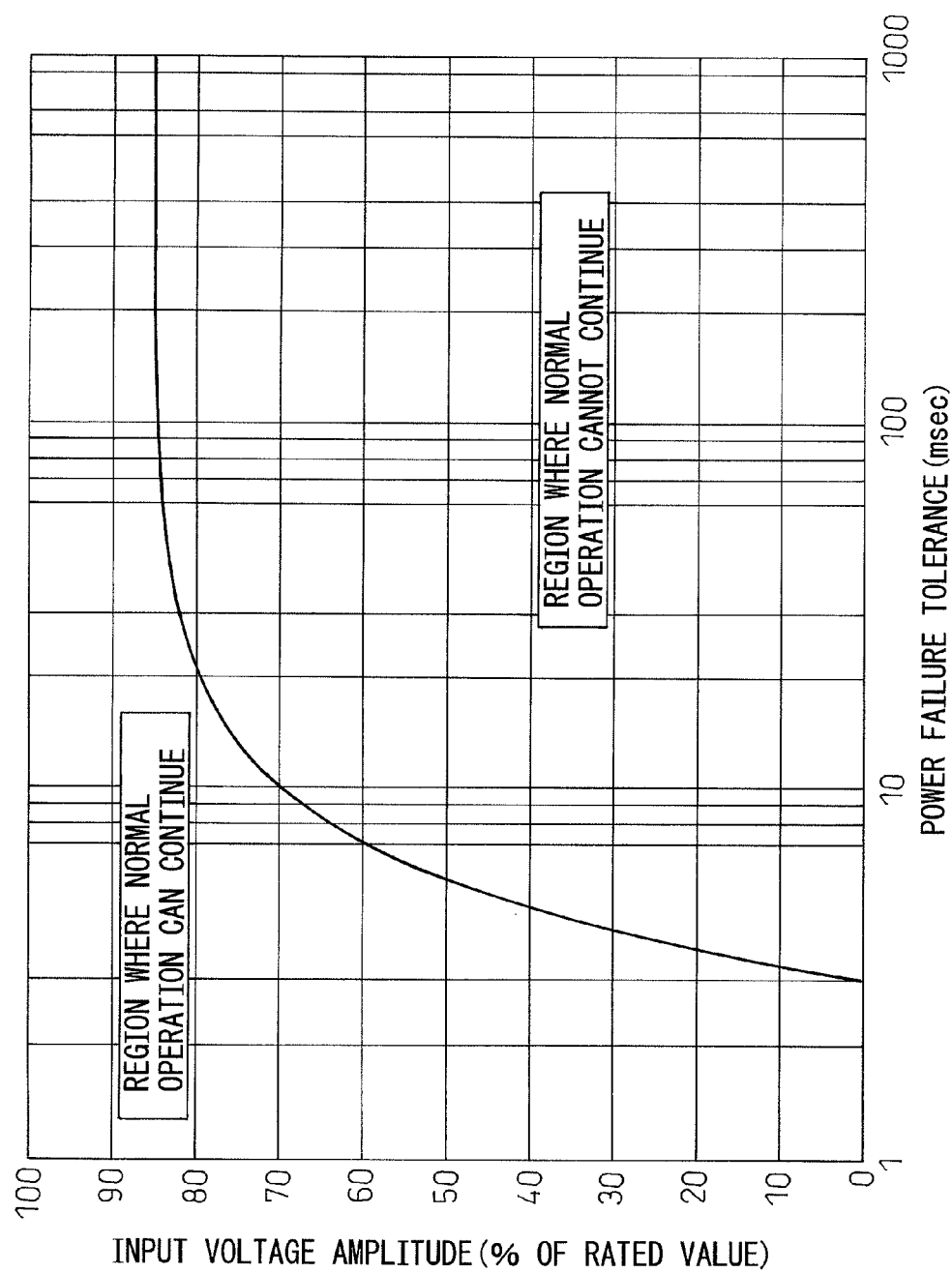
FIG. 2 is a graph illustrating a relationship between an input voltage amplitude and a power failure tolerance.

The time during which motor driving device 10 can continue normal operation, or power failure tolerance, varies depending on the voltage amplitude of three-phase AC input power source 12. FIG. 2 illustrates a relationship between the input voltage amplitude and the power failure tolerance. In the example of FIG. 2, if the input voltage amplitude is 85% or more of the rated value, the power failure tolerance is infinite, in other words, motor driving device 10 can continue the normal operation. If the input voltage amplitude decreases to 70% of the rated value, motor driving device 10 can operate normally for 10 msec after that, due to energy stored in capacitance of capacitors (not shown) in the circuit and inductance of windings of motors 18 and the like. If the input voltage amplitude decreases to 0% of the rated value, motor driving device 10 can operate normally for 3 msec. Since the relationship between the input voltage amplitude and the power failure tolerance differs from device to device, it should be actually measured in advance.

In this patent specification, the time value obtained by the subtraction of the time required to start the switching operation upon the power failure and a certain margin if necessary from the time during which motor driving device 10 can continue the normal operation at each input voltage amplitude is defined as the "power failure tolerance". In the example illustrated in FIG. 2, it is assumed that the input voltage amplitude decreases to 70% of the rated value and it is kept constant after that. In this case, if the switching operation is started 10 msec after the voltage drop, the accurate power failure detection can be achieved. Further, if the input voltage amplitude decreases to 0% of the rated value, the switching operation can be started 3 msec after that.

Figure 3:
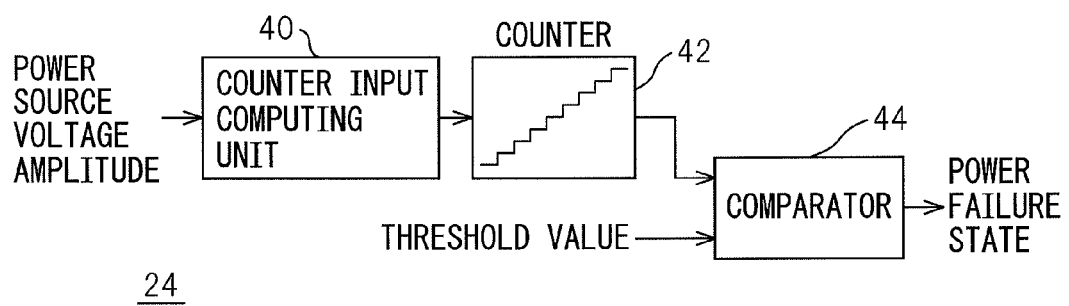
FIG. 3 is a functional block diagram illustrating a detailed configuration of a power failure detection section 24.

FIG. 3 is a functional block diagram illustrating a configuration of power failure detection section 24 of FIG. 1. A counter input computing unit 40 determines the power failure tolerance from the voltage amplitude from voltage amplitude computing unit 22 (FIG. 1) by using the relationship of FIG. 2 measured and stored in advance and then, determines and outputs, as a counter input value, a value that is inversely proportional to the determined power failure tolerance. A counter 42 accumulates the counter input value from counter input computing unit 40 at predetermined intervals. A comparator 44 compares an output of counter 42 with a predetermined threshold value and outputs the result. If the output from counter 42 exceeds the threshold value, it is determined that the power failure occurs. If the output from counter 42 is less than or equal to the threshold value, it is determined that the power failure has not occurred.

Assuming that the power failure tolerance is Q [msec], the accumulation interval of counter 42 is T [msec] and an arbitrary constant is a, the counter input value and the threshold value are set as follows:

The counter input value=a/Q

The threshold value=a/T

With these settings, assuming a situation in which the input voltage amplitude decreases till the power failure tolerance Q becomes a finite value and, then, the input voltage amplitude is kept constant so that the power failure tolerance Q is also kept constant, a/Q is added to counter 42 every T (msec). Consequently, with regard to the time taken until the output of counter 42 reaches the threshold value a/T, a relationship $$a/T=(a/Q)\times(t/T)$$

holds and, as a result, $$t=Q$$

also holds. Consequently, the output of counter 42 reaches the threshold value after the time corresponding to the power failure tolerance Q elapses.

In reality, the input voltage amplitude varies from moment to moment and, accordingly, the power failure tolerance also varies from moment to moment. Consequently, by adding the corresponding value a/Q to the counter and determining the power failure based on the threshold value a/T, the power failure can be accurately detected with a relatively simple configuration.

Figure 4:
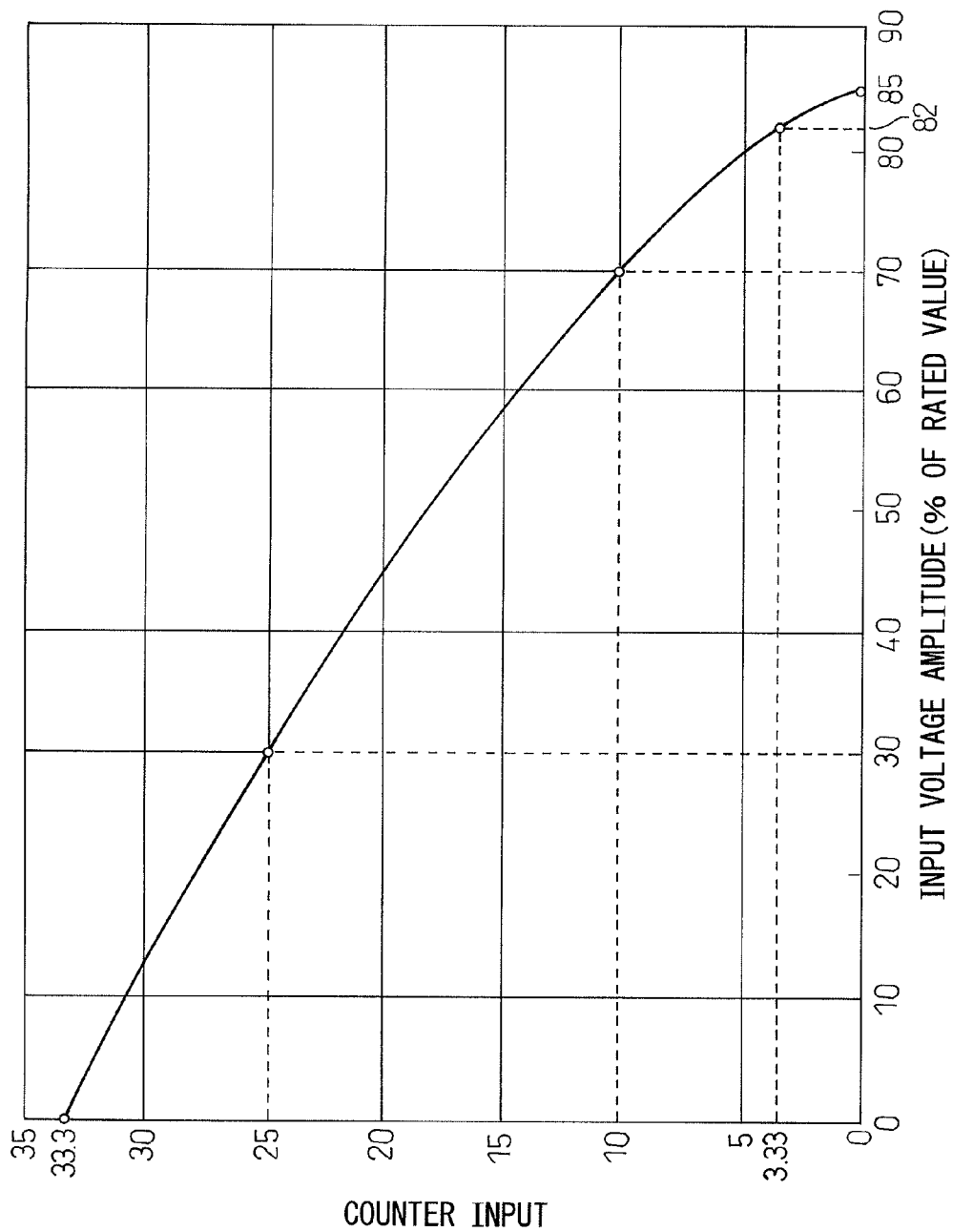
FIG. 4 is a graph illustrating a relationship between an input voltage amplitude and a counter input.

The relationship between the input voltage amplitude and the counter input value a/Q when a=100 is illustrated in FIG. 4. By storing the relationship of FIG. 4 in advance in place of the relationship of FIG. 2, counter input computing unit 40 can be configured more simply.

When the output of counter input computing unit 40 becomes zero, in other words, when the power source voltage returns to the level where the normal operation can continue (in the example described above, when the power source voltage returns to a value equal to or more than 85% of the rated value), the counter accumulation value is cleared. If the counter accumulation value is not cleared and, then, the voltage decreases again, the power failure is detected in a time shorter than the actual power failure tolerance and by clearing the counter accumulation value upon the return of the power source voltage, this problem can be avoided.

The invention claimed is:

1. A motor driving device having a rectifier for converting three-phase AC input power source into DC power, and at least one inverter for converting the DC power into AC power of a desired frequency, comprising:

a voltage amplitude detection section for detecting a voltage amplitude value of said three-phase AC input power source;

a counter input determination section for determining, as a counter input value, a value that is inversely proportional to a power failure tolerance determined from the voltage amplitude value detected by said voltage amplitude detection section;

a counter for accumulating the counter input value determined by said counter input determination section at predetermined intervals; and a power failure detection section for detecting power failure or voltage sag by comparing an output of said counter with a predetermined threshold value.

2. A motor driving device according to claim 1, wherein, when said counter input value is zero, the output of said counter is reset to its initial value.

\* \* \* \* \*